United States Patent [19]
Henkels et al.

[11] Patent Number: 6,151,266
[45] Date of Patent: Nov. 21, 2000

[54] ASYNCHRONOUS MULTIPORT REGISTER FILE WITH SELF RESETTING WRITE OPERATION

[75] Inventors: Walter Harvey Henkels, deceased, late of Putnam Valley, N.Y., by Lois E. Henkels, legal representative; Wei Hwang, Armonk; Rajiv Vasant Joshi, Yorktown Heights, both of N.Y.

[73] Assignee: International Business Machines Corporation, Armonk, N.Y.

[21] Appl. No.: 08/943,738

[22] Filed: Oct. 3, 1997

[51] Int. Cl.$^7$ ........................................ G11C 8/00
[52] U.S. Cl. ............................... 365/230.06; 365/230.05
[58] Field of Search ................... 365/230.06, 189.08, 365/230.05, 230.08, 230.01

[56] References Cited

U.S. PATENT DOCUMENTS

| | | | |
|---|---|---|---|
| 5,293,347 | 3/1994 | Ogaws | 365/230.06 |
| 5,329,493 | 7/1994 | Meyer et al. | 365/230.05 |
| 5,513,139 | 4/1996 | Butler | 365/230.05 |

*Primary Examiner*—Tan T. Nguyen
*Attorney, Agent, or Firm*—Robert P. Tassinari, Jr.

[57] ABSTRACT

Self-reset and write control circuits for high performance asynchronous multiport register files are disclosed. The high speed write operation is achieved by the combination of static data input and dynamic data control circuits. The write timing signal generation, true and complement address buffer, decoder and wordline drivers, and write enable circuits employ the advantages of a fully custom designed methodology with self-resetting complementary metal oxide semiconductor (SRCMOS) circuit techniques. Individual write enable pulses applied to respective input ports of a multiport register cell are effective to establish a priority among those input ports. In this design, the priority of the B-write-port over the A-write-port is established when both write ports address the same register. The present invention provides an effective input isolation/decoupling circuit technique which allows the input pulse widths to vary over a wide range. This allows the write operation to be insensitive to control pulse widths, resulting in effective input isolation scheme.

16 Claims, 13 Drawing Sheets

Synchronous Logic

Fig. 1a

Asynchronous with "Handshaking"

Fig. 1b

Asynchronous without Feedback Between Macros

ASYNCHRONOUS MULTIPORT REGISTER FILE WITH SELF RESETTING WRITE OPERATION

FIELD OF THE INVENTION

The present invention relates generally to write control circuits and, more particularly, to asynchronous dynamic macros such as register files, translation lookaside buffers (TLB) and cache units used in the data or instruction paths of microprocessors.

BACKGROUND OF THE INVENTION

The register file and cache memory are part of the microprocessor complex, and are built on the same microprocessor chip. Register file transfer operations are directly controlled by the micro-processor after instructions are decoded. Register file transfer is conducted at microprocessor speed, usually in one clock cycle, and high performance microprocessors therefore require high performance register files.

The advent of superscalar architectures for microprocessors has created the need for register files having many ports. Such multiporting, however, conflicts with the universal goals of high density, high performance and ease of testing. High density multiporting favors single-ended reading and writing. However, single-ended operation makes high-performance more difficult to achieve. Furthermore, simultaneous write operations at different ports pose challenges.

As computer system performance requirements have increased, high performance microprocessor chips have increased their use of dynamic approaches in design. Dynamic logic can be classified into synchronous or asynchronous systems. See J. Hennessy and D. A. Patterson, "Computer Architecture—A quantitative approach", Morgan Kaufmann, 1996; and N. weste and K. Eshraghian, "Principles of CMOS VLSI Design: A Systems Perspective", 2nd edition, Reading, Mass.: Addison-Wesley, 1993.

Figure 1A:
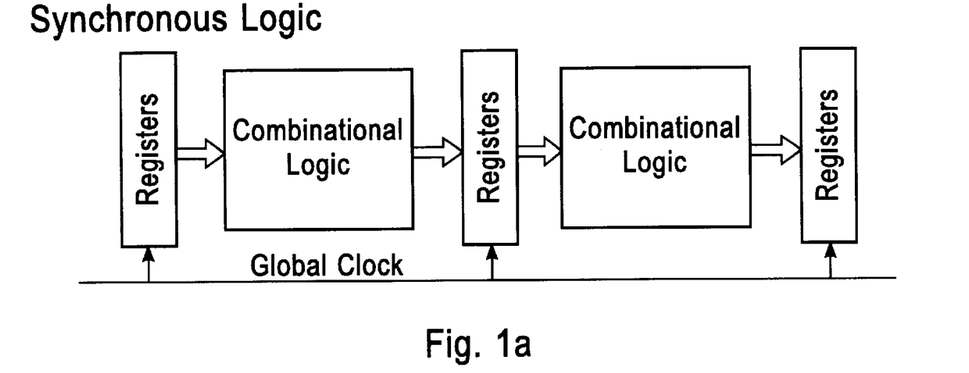
FIGS. 1a–1c are schematic block diagrams of dynamic logic circuits, classified into three categories: (a) synchronous logic; (b) asynchronous with handshaking; and (c) asynchronous without feedback between macros.

Systems such as the one depicted in FIG. 1a, which are synchronized to a global clock, are called synchronous. Synchronous systems require synchronization of the setting of latches to the global clock. The information stored in latches and registers can be updated (a new state replacing a present state) in a controlled and predictable manner by triggering from a periodic global clock signal distributed throughout the digital stages. The global clock ensures that all memory elements change state at approximately the same time.

Figure 1B:
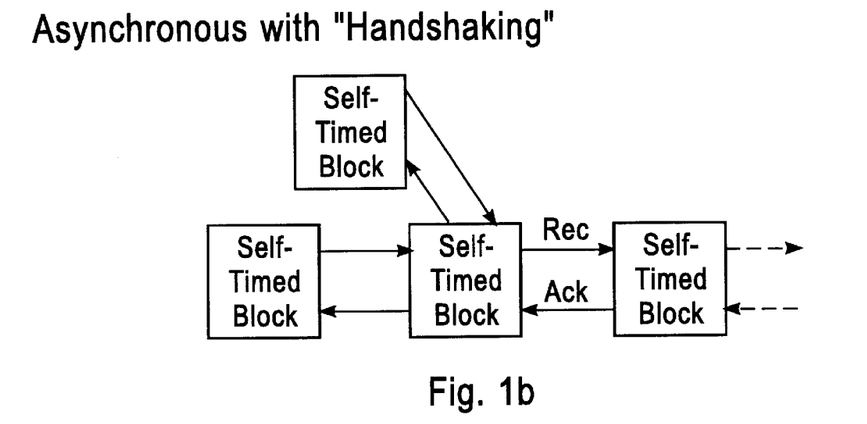

Asynchronous systems, such as the one shown in FIG. 1b, have no global clock distribution, and rely on either handshake or interlock circuit techniques. See, e.g., J. P. Uyemura, "Circuit Design for CMOS VLSI", Boston, Mass., Kluwer Academic Publishers, 1992; and I. Sutherland, "Micropipelines", Communication of the ACM, Vol. 32, pp. 720–738, 1989.

Figure 1C:
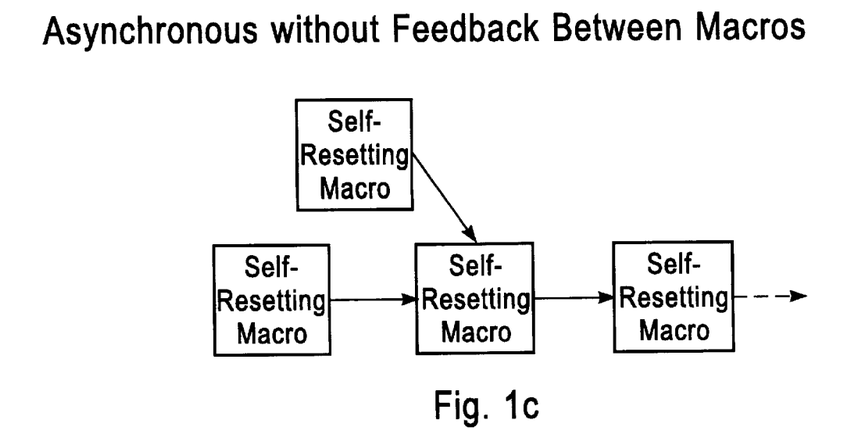

FIG. 1c depicts a self-resetting asynchronous system without feedback between macros. Such systems are designed completely independently of any system clock. In self-resetting techniques, the reset is derived locally either by feedback from downstream evaluation logic, or from a local timing chain triggered by an upstream event. When cycle time is too long, the reset circuits can be broken up into more self-resetting pipe macros, with overlapping reset. Thus the self-resetting macros as shown in FIG. 1c are self-contained.

Each macro in FIG. 1c consists of its own evaluation path and reset chain. Each macro performs locally and asynchronously to the global system clock. Self-resetting circuits are preferable to synchronous domino-logic of higher performance because of the absence of any clocking precharge devices in the logic trees, and the corresponding reduction in loading on clock distribution of the system clock. This alleviates clock skew and power problems. The self-resetting case is difficult to design at the system level because of the lack of the global synchronization provided by a global clock, although there has been substantial work in this area. See e.g., W. Henkels, W. Hwang and T. I. Chappell, "Cells and Read-Circuits for High Performance Register Files" U.S. Pat. No. 5,481,495; and U.S. Pat. No. 5,617,047, W. Henkels, W. Hwang and R. V. Joshi, "Reset-and-Pulse-width-control Circuits for High Performance Multiport Register Files" U.S. Pat. No. 5,617,047.

The present invention allows the realization of high performance multiport register files for the WRITE operation. We propose alternatives for use in advanced register file design. The present invention is highly attractive in many circumstances.

SUMMARY OF THE INVENTION

It is an object of the invention to provide improved asynchronous dynamic logic and circuit techniques for achieving high speed write operations in register files or cache memory with high data rates.

It is an object of the present invention to provide a write control circuit for multiport register files or cache memory which applies input isolation techniques. It provides tolerance to a varying range of input control pulse widths yet delivers identical output pulses.

It is an object of the invention to provide a write control macro having an input isolator, forward evaluation path logic and reset trigger, and reset pulse generator in three stage circuit blocks.

It is another object of the invention to provide self-resetting asynchronous write control circuits without feedback between two macros. Such circuits are designed totally independent of any system clock.

It is another object of the invention to provide a master-write enable timing signal, labeled WETS, which triggers asynchronous macros without global clock inputs, without the need for using handshaking circuit techniques.

It is another object of the invention to provide an input isolator mixed static input and dynamic output circuit design, and an input isolator having both an isolation function and amplification function.

It is another object of the invention to provide that with each port of a write address there is a corresponding write enable.

It is another object of the invention to provide a write-address-timing-signal, labeled WATS, for converting single-rail write addresses to dual rail.

It is a further object of the invention to provide that the write address buffer, write decoder and write-auxiliary circuits all employ self-resetting CMOS circuits.

It is a further object of the invention to provide interaction between forward evaluation path circuits and reset generation circuits to ensure that reset pulses reset the dynamic nodes in proper timing.

DETAILED DESCRIPTION OF A PREFERRED EMBODIMENT OF THE INVENTION

A more detailed description of the invention will now be given with reference to the drawings. These drawings are shown as illustrations of the invention but they do not restrict its scope as set forth in the appended claims.

Figure 2:
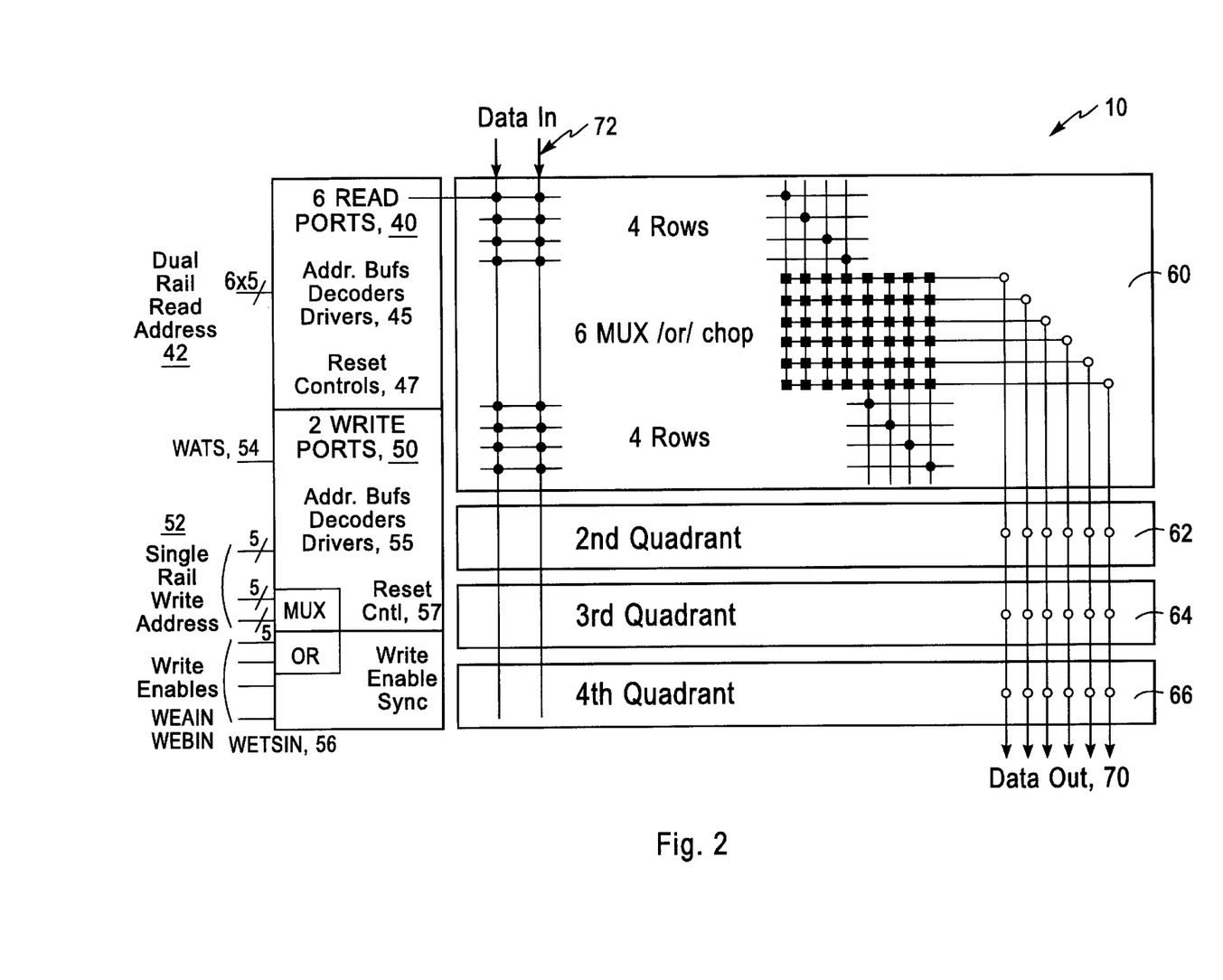
FIG. 2 illustrates an example of a multiport register file.

FIG. 2 shows a block diagram of a register file 10 in accordance with the invention. It consists of m words X n bits/word and features eight independent I/O ports: six read ports and two write ports. Each write port is n bits wide and can write to any of the m word locations at the beginning of a cycle. The six independent read ports are also n bits wide and can read from any of the m word locations during the later part of the cycle.

With respect to the read-paths, the m-word X n-bit register file is partitioned into four quadrants 60, 62, 64 and 66. The output of all quadrants are dotted together. A read-access of the register file consists of decoding, multiplexing, and driving the output line. The data outputs 70 are single-rail dynamic signals. The input read addresses 42 are dual-rail dynamic signals. Reset controls 47 are also provided for proper circuit operation. The detailed read port circuits are described in U.S. Pat. No. 5,481,495, and U.S. Pat. No. 5,617,047, incorporated herein by reference.

In order to insure the robustness and flexibility of the write operation, data inputs are designed to require the (non-partitioned) write bit lines 72 to be static, while allowing data write controls to be dynamic. With each set of write addresses there is a corresponding write-enable. The single-rail write addresses 52 are converted to dual-rail signals by a strobe signal—write-address-timing signal (WATS) 54.

In accordance with the invention, there is no global clock input to the register file 10. Triggering of a write operation is accomplished by activation of a master write-enable timing signal (WETS) 56. The six read ports are totally independent of each other, sharing only memory cells. As such, there is no required timing relationship between read-ports. On the other hand, the write ports are synchronized, by WETS, because the write word lines must be synchronized with the data inputs.

The write decoder/driver 55 and reset circuits 57 could be made very similar to the read circuits 45 and 47. However, in the present design the write circuits differ somewhat because of additional functions included for a particular processor architecture for which this register file is intended. Consequently we chose to employ single rail dynamic inputs for all write controls, and we use a novel input isolation scheme, wherein an input pulse is caught, and then input-isolated; there is no write address interlock. All internal pulse edges are correlated to the leading edge of the master write-enable signal, WETS. This scheme will now be discussed in detail.

Figure 3:
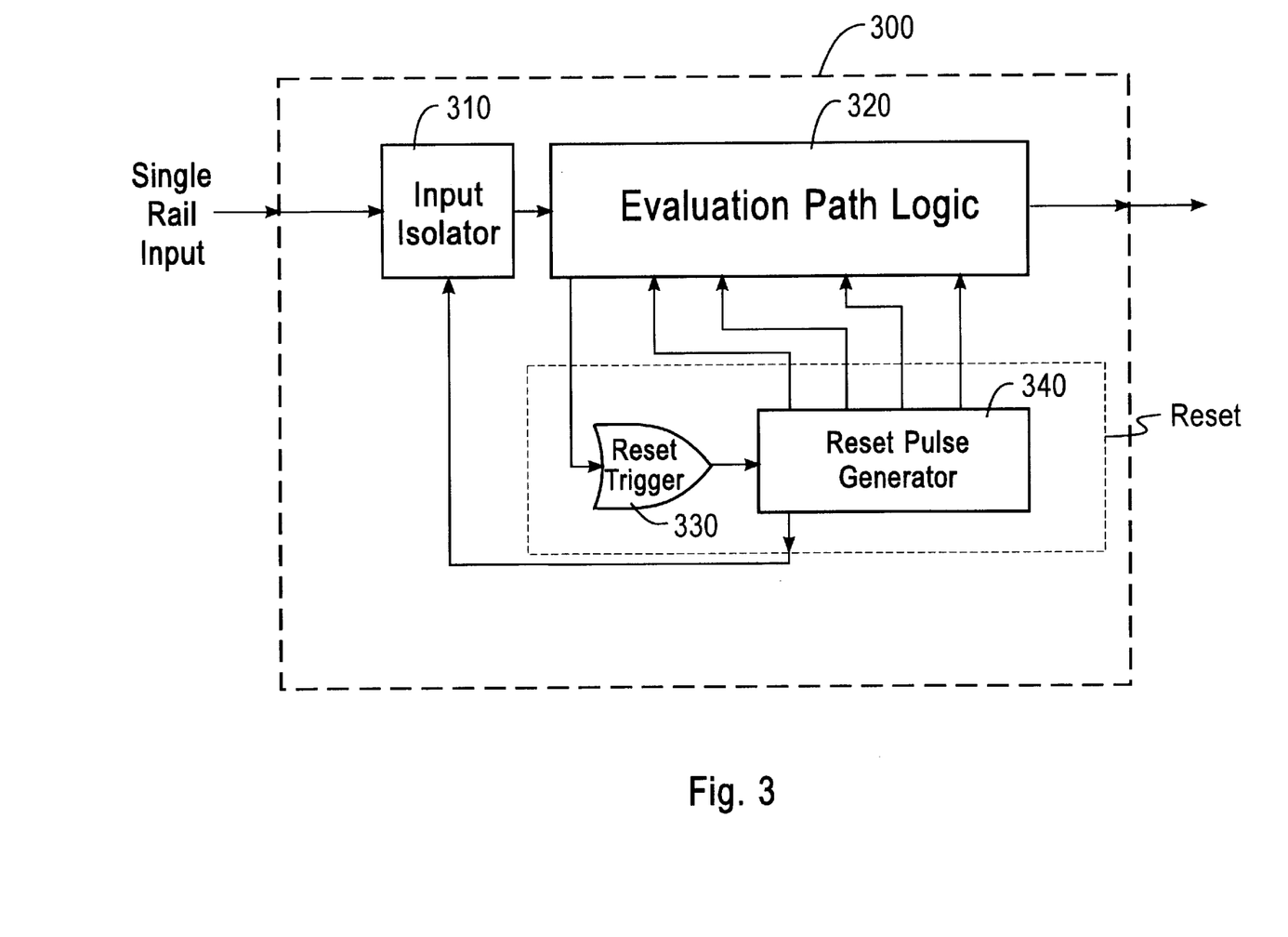
FIG. 3 is a high level diagram of a self-resetting write port macro which includes an input isolator which conditions an input signal to achieve a desired output pulsewidth.

FIG. 3 shows a high level diagram of a self-resetting write port macro which includes an input isolator to achieve insensitivity of output pulsewidth. The macro includes single rail inputs, an evaluation forward path and a reset generation path.

The write-port macro of FIG. 3 includes an input isolator 310, forward evaluation path logic block 320, reset trigger circuit 330 and reset pulse generator 340. In accordance with the invention, and as described below, a novel input isolation scheme is employed, wherein an input pulse is caught, and then the input isolated—there is no input logic interlock.

The present approach desensitizes a self-resetting, or self-timed, macro to the pulsewidth of an input signal without significantly penalizing path performance. As such, employment of the circuit effectively decouples the design of interfacing macros, making an individual macro's design much more independent and flexible. The circuit can be made very fast, and is compatible with fast self-resetting CMOS and other dynamic circuits.

Figure 4:
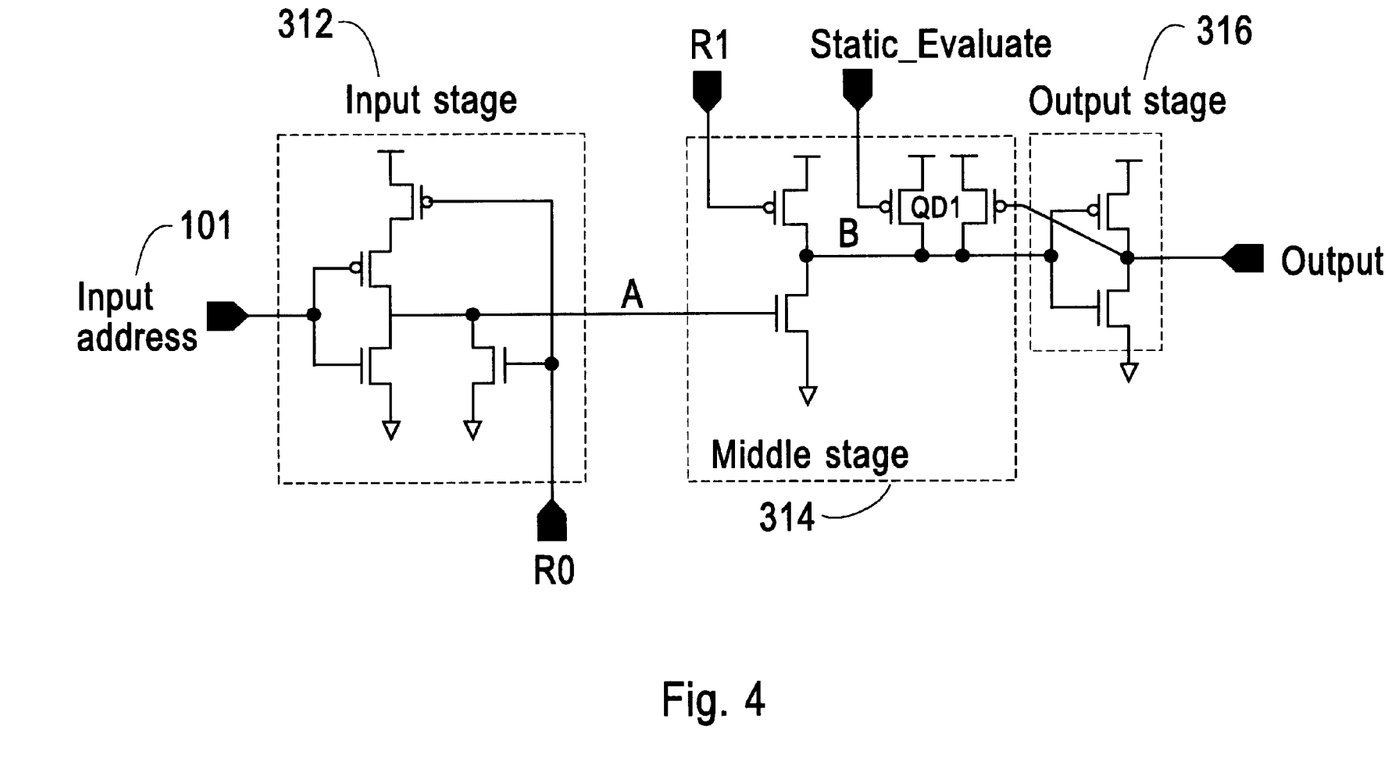
FIG. 4 represents a schematic of a preferred implementation of an input isolator for the SRCMOS macro.
Figure 11:
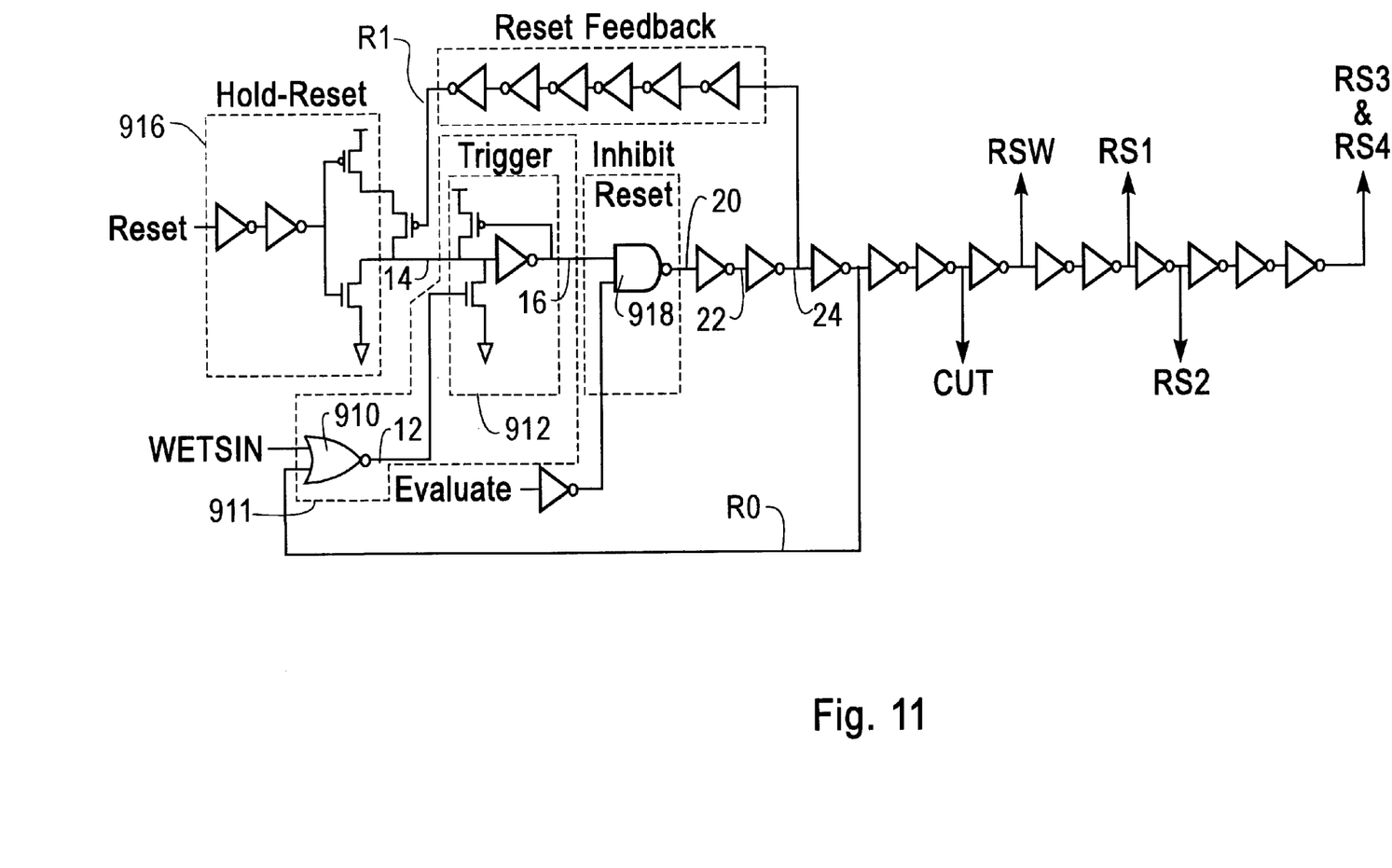
FIG. 11 shows a circuit schematic for a reset pulse generation and timing control circuit for write ports.

The input isolation circuit is shown schematically in FIG. 4. This circuit is used to condition the signal input to each functional circuit block in the system, as will be shown later with respect to FIG. 13. This circuit performs both an isolation function and an amplification function. The input stage 312 is a static-NOR circuit, with the standby state at input 101 being high, and the standby state of signal R0 being low. The middle stage 314 is a one-input dynamic-NOR circuit which is reset by signal R1. The output stage 316 is an output half-latch with feedback to a small standby device. The outside stage controls noise and holds the dynamic output node high during standby. Signals R0 and R1 are generated sequentially (R0 first, R1 second) from a timing chain as depicted in FIG. 11. R0 is active high, whereas R1 is active low.

Input stage 312 performs a pulse-chopping function on any input pulse which is too wide, whereas the middle stage 314 serves to capture an input which is reset too soon. These characteristics can be seen clearly with reference to the timing diagram in FIG. 4. The R0 signal resets node-A independently of the input resetting—this insures that there is no collision on node-B and that node B does not reset until R1 is active—hence the output pulsewidth is not affected by the early resetting of the input 101. Thus, in combination, the circuits in FIG. 4 provide an output pulse which is highly insensitive to the pulsewidth of the input pulse at input 101.

Figure 5:
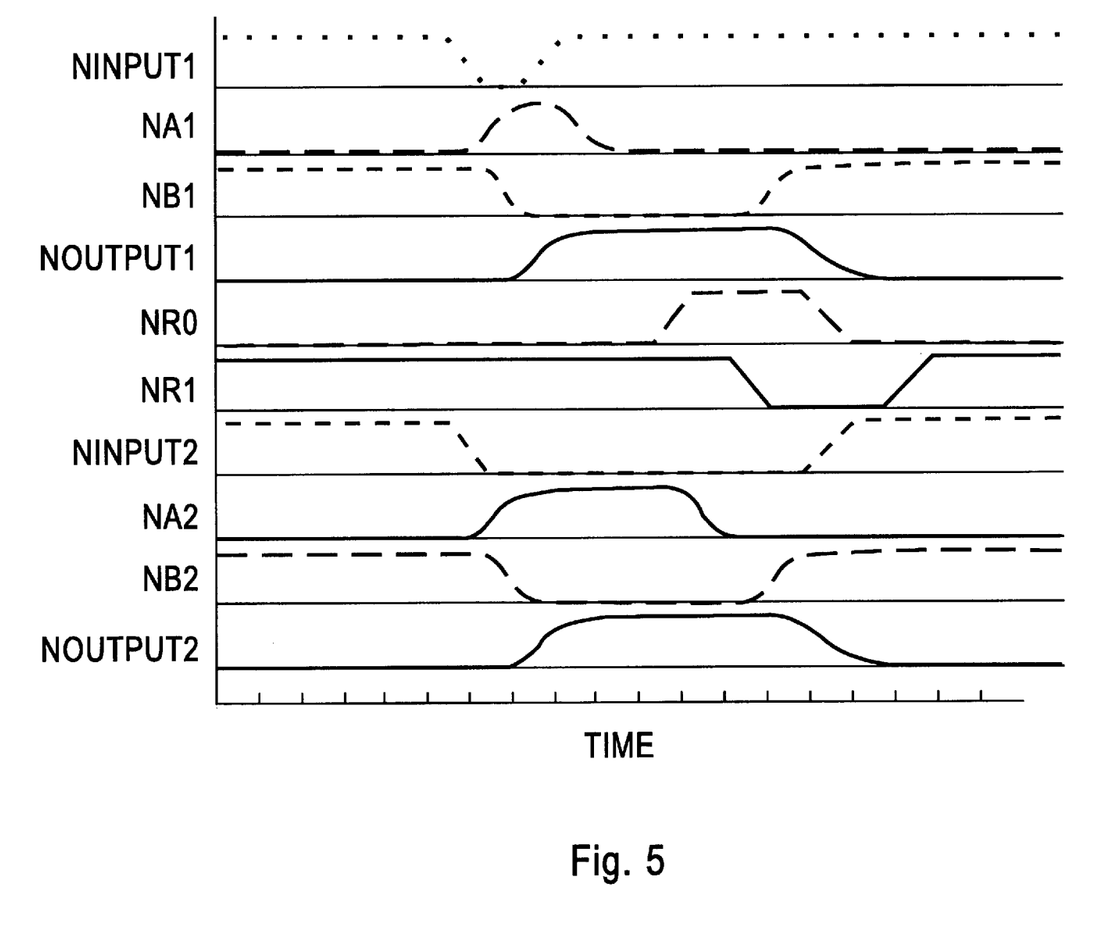
FIG. 5 shows the simulation waveforms for the macro of FIG. 4.

Simulation waveforms of the circuit of FIG. 4 for a 1 pf load are shown in FIG. 5. The upper waveforms show a first case in which the input pulsewidth NINPUT1 is narrow, 300 ps. Node-A and node-B waveforms are represented as NA1 and NB1, respectively. The output waveform is represented as NOUTPUT1. Similarly, a second case is depicted in which the input pulsewidth NINPUT2 is wide, 1400 ps. Node-A and node-B waveforms are represented as NA2 and NB1, respectively. The output waveform is represented as NOUTPUT2. The reset signals, R0 and R1, are the same for both cases. It can be seen that the output pulses NOUTPUT1 and NOUTPUT2 are identical, and there are no pulse collisions in this wide input variation. Note that the inclusion of a static-evaluation device QD1 in the circuit of FIG. 4 is optional. Signals R0 and R1 are pulses generated from other circuits within the register macro, which will be described in FIG. 11. In this implementation, at standby, R0 is low, R1 is high, the input is high, node-A low, node-B high and the output low.

Figure 6:
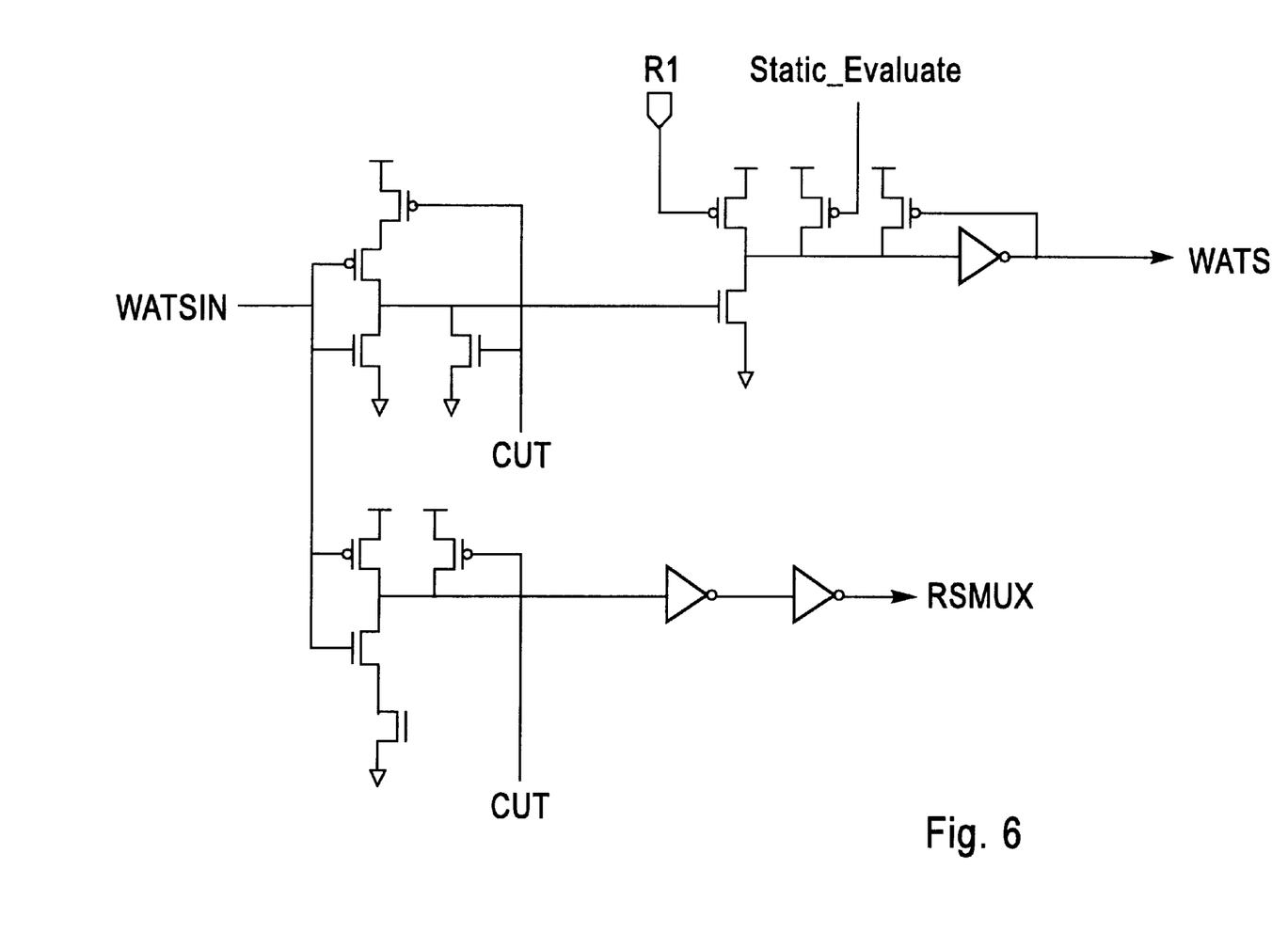
FIG. 6 shows a strobe write-address-timing-signal (WATS) buffer circuit for the macro of FIG. 4.

FIG. 6 is a schematic diagram of a strobe write-address-timing-signal (WATS) buffer circuit 400. This buffer circuit receives a common input global master timing signal WATSIN from the system CPU (not shown and then generates two different local branch output signals, WATS and RSMUX. These signals are used in the B-port write address and true/complement generator of FIG. 8, discussed below. The schematic structure of the upper branch for the WATS signal generation is identical to the input isolator of FIG. 4, except the reset signal R0 in FIG. 4 is replaced by the reset signal CUT (which will be described in FIG. 11). The schematic structure of the lower branch is a timing delay chain which receives two inputs WATSIN and CUT and then generates reset timing signal RSMUX.

Figure 7:
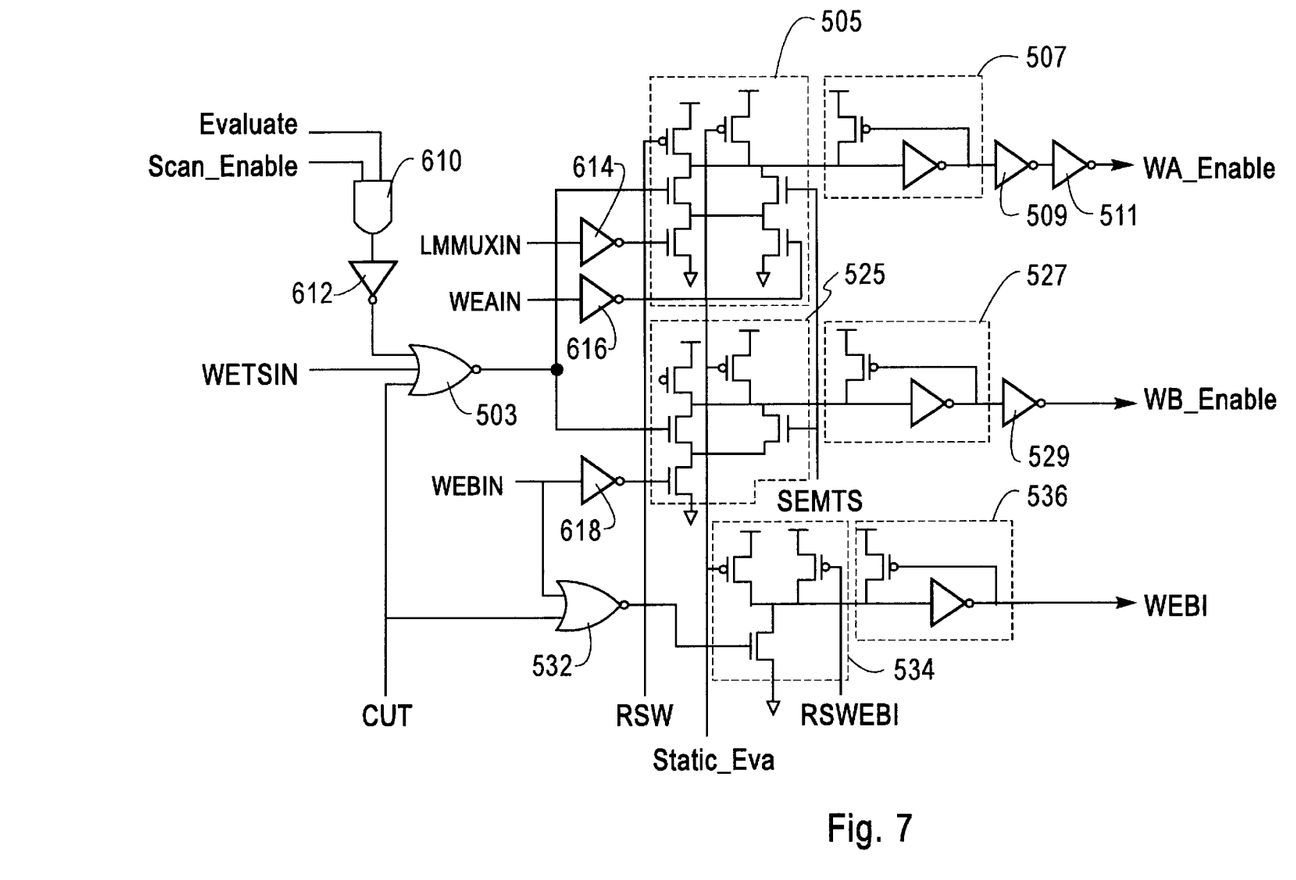
FIG. 7 is schematic of a preferred circuit for generating the triggering timing signal for two write ports, by means of the activation of a master write enable signal.
Figure 10:
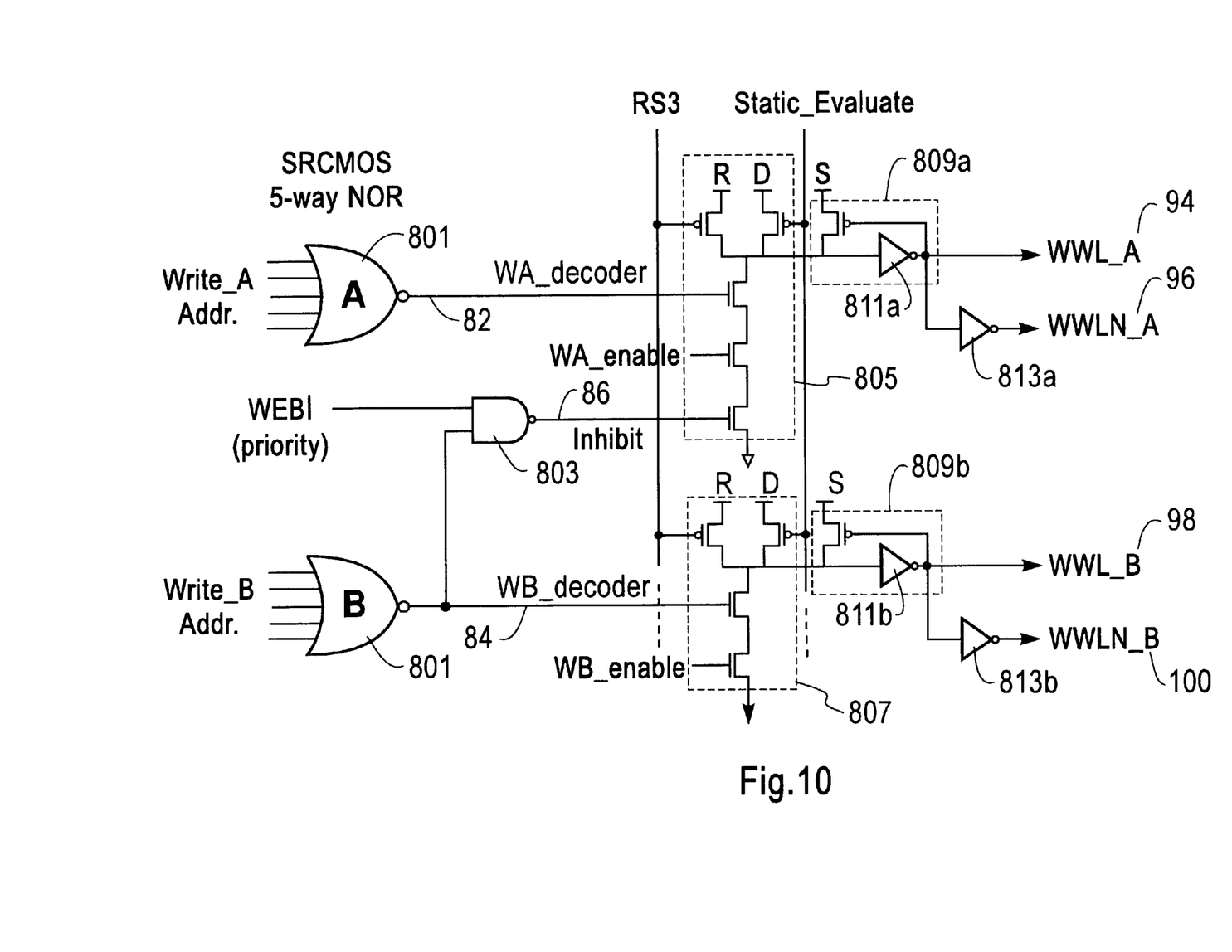
FIG. 10 shows a circuit schematic for a write decoder and write-wordline drivers.

FIG. 7 is a schematic diagram of a preferred embodiment of a circuit for generating write enable and priority timing signals WA_enable, WB_enable and WEBI, which are used in the write decoder and WWL driver circuit of FIG. 10. These timing signals are triggered by activation of a master write enable WETSIN signal from the CPU (not shown). We will describe the three circuit branches as follows.

We first describe the priority WEBI 530 branch, located at the bottom part of the circuit schematic of FIG. 7. The design is identical to the input isolator shown in FIG. 4. The input stage is a static two-way NOR circuit 532, with the input WEBIN having a standby state of high, and with the input CUT having a standby state of low. The middle stage of the WEBI branch is a one-input SRCMOS NOR circuit 534 which is reset by RSWEB1, and the last stage is an output half-latch 536. Signals WEBIN, WEAIN, and LMMUXIN are generated and received from the system CPU, via an input isolation circuit in accordance with FIG. 4.

The WA_enable branch of the circuit of FIG. 7 is located at the upper part of the circuit schematic. The input stage is a static three-way NOR circuit 503, with input WETSIN having a standby state of high, and with the standby state of input CUT being low. A third input testing signal is generated from the global testing signals Evaluate and Scan_enable through a static NAND 610 and an inverter 620.

The standby state of this third signal is high. The middle stage of the WA_enable branch is a SRCMOS four-way AOI circuit 505 which receives the output signal of the static 3-way NOR circuit 503, the input signal LMMUXIN through a buffer 614, and the input signal WEAIN through a buffer 616 and is reset by SEMTS which is generated by the circuit of FIG. 11. The last stage of the WA_enable branch is an output half-latch 507 plus two inverters 509 and 511 to generate the write enable output signal for write port A, WA_enable.

The WB_enable branch is located in the middle part of the circuit schematic of FIG. 7. In this case, the input stage is a static three-way NOR circuit 503, which is shared with the upper branch of the circuit. The middle stage is a SRCMOS three-way AOI circuit 525 which receives the output signal of the static 3-way NOR circuit 503 as well as input signal WEBIN through a buffer 618. The circuit is reset by SEMTS. The last stage is an output half-latch 527 plus one inverter 529 to generate the write enable signal for write port B, WB_enable.

Figure 8:
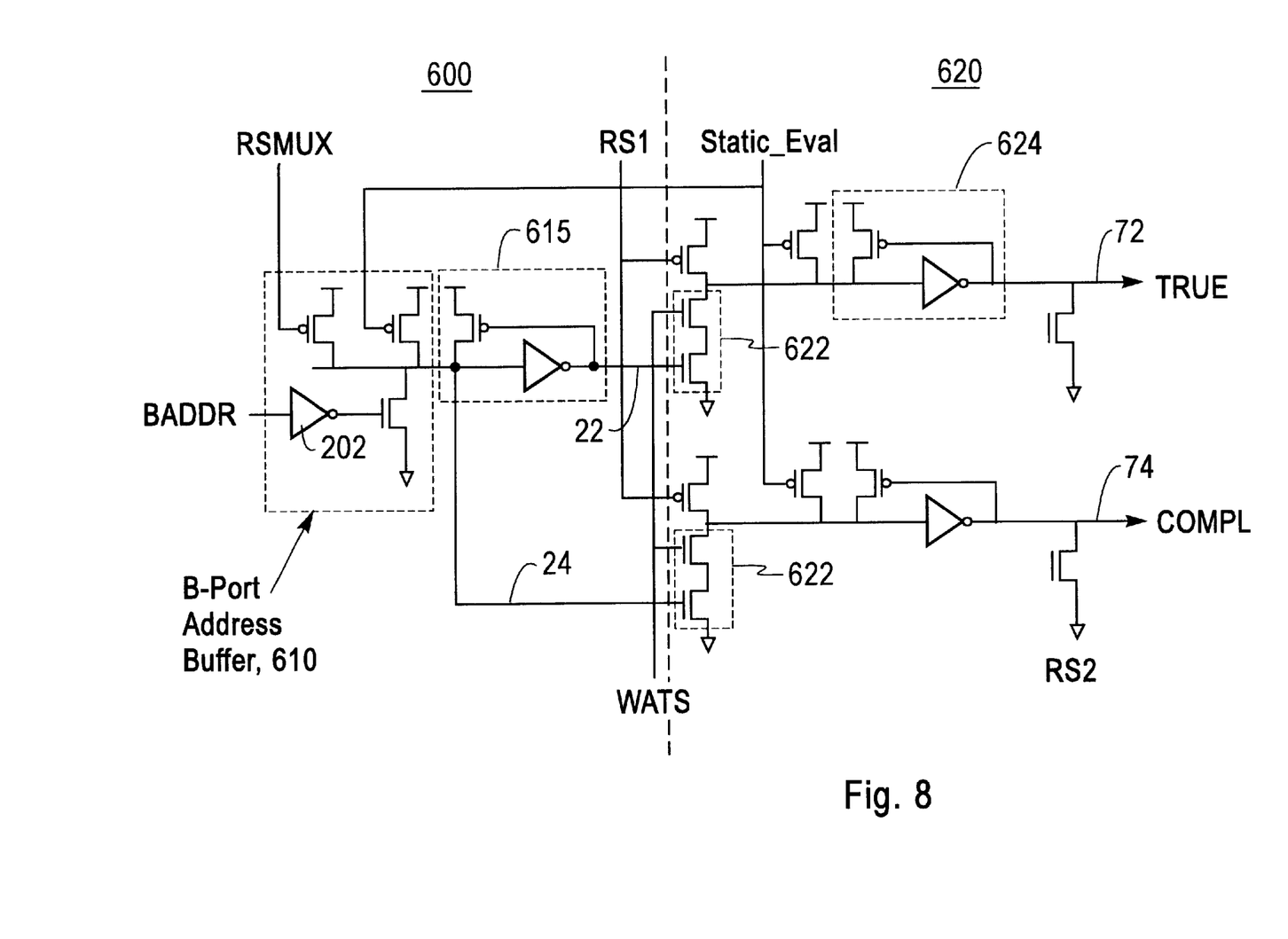
FIG. 8 shows a circuit schematic for a B-port address buffer and true and complement address generation circuit.

FIG. 8 shows the circuit schematic for the B-port write address buffer single-rail to dual rail conversion, and true and complement address generation. It combines two parts, a B-port address buffer 600 and a true and complement address generation circuit 620. The B-port address buffer comprises two stages, as will now be discussed.

The first stage is SRCMOS one-way OR circuit 610 which receives input signal BADDR through an inverter buffer 202 and which is reset by signal RSMUX, which was generated with the circuit of FIG. 6. This first stage is also optionally connected to SRCMOS testing signal Static_Eval as shown.

The second stage is a half-latch circuit 615, which provides true 22 and complement 24 outputs for the B-port address buffer.

The true/complement addresses generation block 620 also comprises two stages. The first stage is a SRCMOS two-way NAND circuit 622 and the second stage is an output half-latch 624. The half-latch includes feedback to a small standby device to control noise and hold the dynamic node high during standby. The inputs 22 and 24 to the two-way NAND are the true and complement address outputs from half-latch 615, and must arrive prior to the other write address timing signal, WATS. The reset signals RS1 and RS2 are generated sequentially (RS1 first, RS2 second) from the timing chain of FIG. 11. The last stage of true complement address generation block 620 generates the B-port write TRUE or COMPL address, at outputs 72 and 74, respectively. The circuit provides the advantage of generating dual-rail true and complement address signals at the same time.

Figure 9:
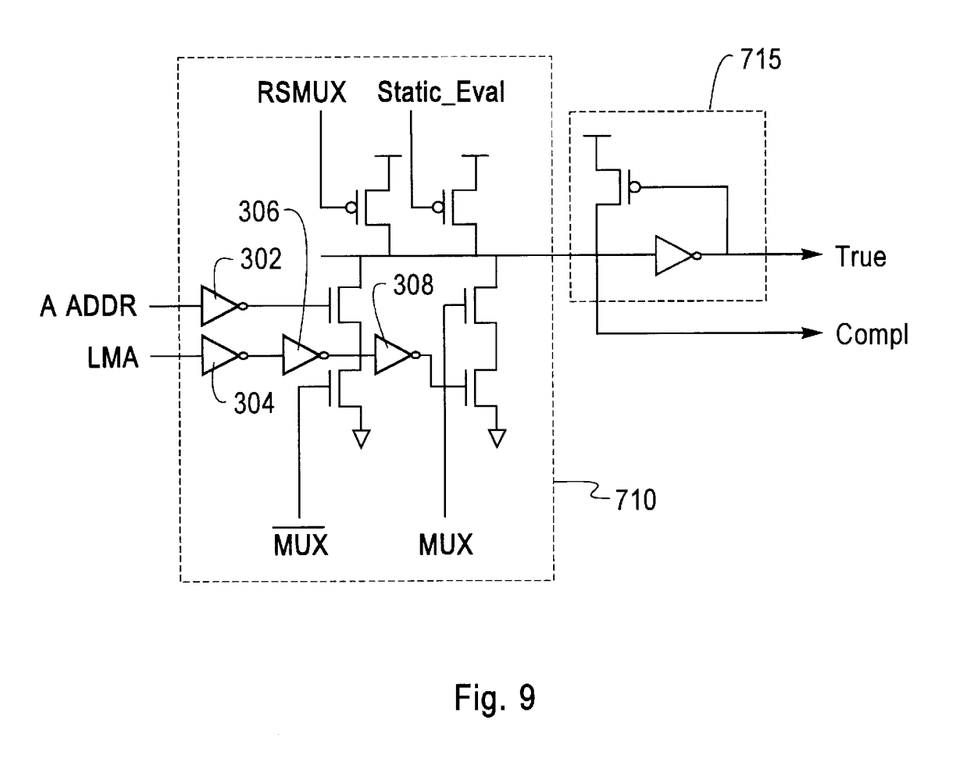
FIG. 9 shows a circuit schematic for an A-port address buffer.

FIG. 9 shows the circuit schematic for the A-port address buffer. The A-port true and complement address generation block 700 is identical to the B-port circuit 620 as shown in FIG. 8. The A-port address buffer comprises two stages. The first stage is SRCMOS four-way AOI circuit 710 which receives input signals AADDR from the CPU via an input isolation circuit through an inverter buffer 302 and MUXB in one leg, and input signals LMA from the CPU, through inverter buffers 304, 306 and 308, and MUX, in another leg. This stage is reset by RSMUX. This stage is also optionally connected to SRCMOS testing signal Static_Eval, as shown. The last stage is a half-latch circuit 715 which provides true 32 and complement 34 outputs for the A-port address buffer.

FIG. 10 shows the circuit schematic for a write decoder and write-word line drivers. SRCMOS 5-way NOR circuits 801 act as A-and B-port address decoders. In order to establish a B-port priority among these two write ports, a static 2-way NAND 803 is provided which generates an inhibit signal. The 2-way NAND 803 receives two input signals: WEBI priority signal, from FIG. 7; and B-port decoder 801 output 84. If both signals pull high, then the inhibit signal at line 86 goes low which will forbid writing to the A-port. The A-port wordline driver comprises an SRCMOS 3-way NAND circuit which receives three inputs: WA_decoder; WA_enable (from FIG. 7) and Inhibit. The B-port wordline driver comprises a SRCMOS 2-way NAND circuit 807 which receives two inputs: WB_decoder; and WB_enable (from FIG. 7). The priority of the B-write-port over the A-write-port is established when both write ports address the same register. In accordance with the SRCMOS methodology, the last stage of the circuit of FIG. 10 includes half-latches 809a and 809b, with small standby devices labeled S, to control noise and hold the dynamic nodes high during standby. The devices labeled D are normally off, and used only in the so-called static-evaluate diagnostic testing mode, wherein they serve as rationed loads for the evaluated nodes. The reset signal, RS3, driven by the reset timing chain of FIG. 11, is high during standby and evaluation, and goes active-low at the appropriate time to reset the discharged nodes via reset gates, labeled R. Each last stage also includes an inverter (811a and 811b) to generate the output. The write enable signal for write ports A and B, are WA_enable and WB_enable, respectively. The dual rail of the A-port and B-port write wordline drivers are generated directly from the output half-latch (811a or 811b) or an output half-latch (811a or 811b) plus one inverter (813a or 813b) resulting in WWL_A (WWL_B) and WWLN_A (WWLN_B), respectively.

FIG. 11 shows the schematic for a preferred reset pulse generation and timing control circuit for the write ports. The two write ports, A-port and B-port, share common reset-control signal RSMUX, WATS, and stat_eval. The objective of the control circuit of FIG. 11 is to generate a plurality of independent reset pulses, in response to the input trigger 911, having an input WETSIN provided by the write port's forward path. These reset pulses are used for resetting the dynamic nodes contained within the respective write-port's forward path logic. The reset pulses must be timed so as not to be in contention with the forward-path pulses. This is done without resorting to a global clock; that is, the write port logic resets itself.

A basic element of the circuit of FIG. 11 is an input isolator, which comprises a static 2-way NOR 910 and SRCMOS one-way OR and half latch 912 to form a reset trigger block 911. The static 2-way NOR 910 receives two inputs: the master write enable signal WETSIN; and reset feedback signal R0. The reset timing chains sequentially generate two feedback signals, R0 and R1, with R0 occurring first and R1 occurring second. R0 is active high, whereas R1 is active low. R0 serves a pulse-chopping function on any WETSIN pulse which is too wide, and R1 serves to reset the dynamic node with proper timing and to capture an input which is reset too soon. The R0 signal resets node 12 independently of the input resetting signal WETSIN. This insures that there is no collision on node 14, which does not reset until R1 is active.

Hence, the output pulse width is not affected by the early resetting of NINPUT of FIG. 5. The result is that the trigger block 911 provides a trigger reset output pulse which is highly insensitive to the pulse width of the input WETSIN.

Two subcircuits of the circuit of FIG. 11 are used for diagnostic testing: the Hold-Reset circuit 916 is used for initialization and holding the reset-state; and the Inhibit-Reset NAND 918 is used for block resetting. The trigger circuit detects when the write-enable WETSIN strobe activates, indicating the triggering of the reset path. The other reset signals—CUT, RSW, RS1, RS2 RS3 and RS4— are generated sequentially. These reset signals are applied to FIGS. 6–10, as shown.

Figure 12:
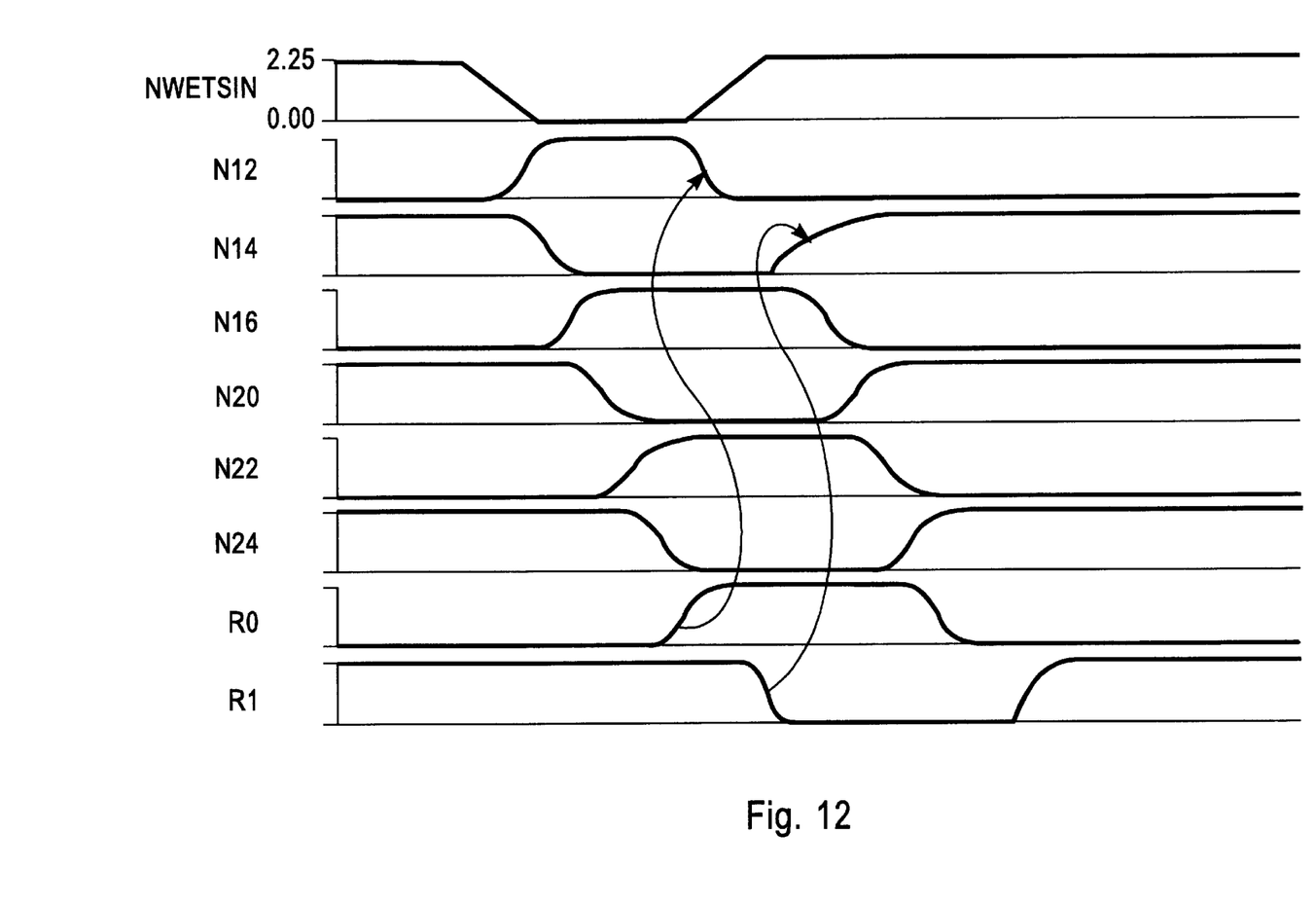
FIG. 12 shows the simulation waveforms for the macro of FIG. 11.

FIG. 12 shows the simulation waveforms for the circuit schematic of FIG. 11. The input WETSIN has a pulsewidth of 800 ps, and waveforms for the correspondingly-numbered nodes of FIG. 11 are represented as N12, N14, N16, N20, N22. The reset signals R0 and R1 are generated to reset the dynamic nodes 12 and 14, respectively. In this implementation, at active state, R0 is high and R1 is low.

Figure 13:
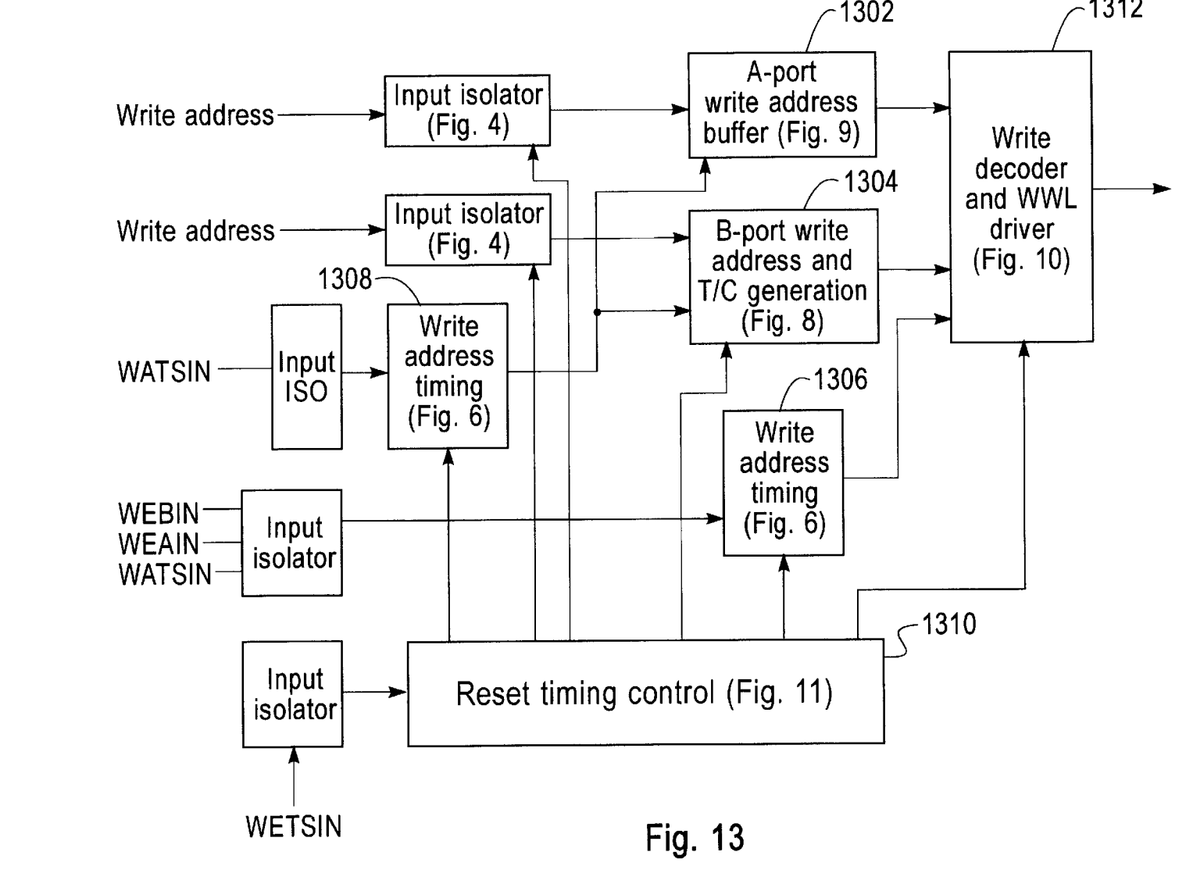
FIG. 13 is a functional block diagram of a system in accordance with the invention.

FIG. 13 is a functional block diagram showing all components of an asynchronous multiport write macro in accordance with the invention. Then diagram shows the relative functional positions of the A-port write address buffer 1302 (shown in detail in FIG. 9), B-port write address and T/C generation circuit 1304 (FIG. 8), write enable circuit 1306 (FIG. 7), write address timing circuit 1308 (FIG. 6), Reset timing control circuit 1310 (FIG. 11), and write decoder and WWL rive circuit 1312 (FIG. 10). Although each functional block is shown as having a separate input isolation circuit, it will be understood that the corresponding isolation circuit might instead be incorporated as part of the circuitry of the functional block. Also, although the functional blocks are connected in FIG. 13 by single lines, it will be understood that in many cases more than one line may be required for signal transfer between blocks.

While the invention has been described in particular with respect to preferred embodiments thereof, it will be understood by those skilled in the art that modifications to the disclosed embodiments can be effected without departing from the spirit and scope of the invention.

What is claimed is:

1. A write address macro for a register file, comprising:
    input isolation circuit means for receiving first and second address signals and a global write enable signal and generating corresponding conditioned output signals of a predetermined duration;
    a first write address buffer for receiving and temporarily storing the first conditioned write address signal from the input isolation circuit;
    a second write address buffer for receiving and temporarily storing the second conditioned write address signal from the input isolation circuit;
    a write decoder and write word line driver circuit coupled to receive the first and second conditioned write address signals from the first and second write address buffers, respectively, including means for generating true and complement word line select signals;
    a write enable signal generator coupled to receive a conditioned write enable signal from the input isolation circuit means, including means for providing one or more write enable signals and a priority signal to the write decoder and write word line driver.

2. The macro of claim 1, wherein the inputs to the isolation circuit means are static, and wherein the outputs of the circuit are dynamic.

3. The macro of claim 2, wherein the input isolation circuit means comprises a first stage which receives the static input signal and performs a pulse chopping operation on the static input signal.

4. The macro of claim 3, wherein the first stage comprises a two-way NOR circuit.

5. The macro of claim 3, wherein the input isolation circuit further comprises a second stage, coupled to receive the output of the first stage, the second stage performing a pulse capture operation on the output of the first stage in the event that the output of the first stage is reset sooner than desired.

6. The macro of claim 5, wherein the second stage comprises a dynamic one-way NOR circuit.

7. The macro of claim 5, wherein the input isolator further comprises a third stage coupled to receive the output of the second stage, the third stage reducing the effects of noise on the output of the second stage, and also maintaining the output of the input isolator at a desired state during standby.

8. The macro of claim 7, wherein the third stage comprises a half-latch circuit.

9. The macro of claim 1, further comprising a write address timing circuit for generating and delivering respective write address timing signals to the first and second write address buffers.

10. The macro of claim 9, further comprising a write address timing signal input isolation circuit including means for receiving a global write address timing signal and generating a conditioned global write address timing signal for delivery to the write address timing circuit, the write address timing circuit generating the respective write address timing signals responsive to the conditioned global write address signal.

11. The macro of claim 1, further comprising a write enable signal input isolation circuit comprising means for receiving one or more global write enable signals and generating one or more corresponding conditioned global write enable signals for delivery to the write enable signal generator.

12. The macro of claim 11, wherein the write enable signal input isolation circuit comprises:

an input stage including means for performing a pulse-chopping operation on input pulses longer than a desired duration, said means including a static three-way NOR circuit;

a middle stage including means for capturing input pulses that are reset faster than desired, said means including a three-way AOI circuit;

an output stage including means for reducing the effects of noise on signals received from the second stage and for holding the output of the write enable signal isolation circuit in a predetermined state at standby, said means including a half-latch with feedback to a small standby device.

13. The macro of claim 1, wherein the first write address buffer includes a first stage comprising a four-way AOI circuit and a second stage, coupled to receive the output of the first stage, comprising a half latch circuit.

14. The macro of claim 1, wherein the second write address buffer includes:

a write port address buffer, the write port address buffer comprising a first stage that includes a one-way OR circuit, and a second stage, coupled to the output of the first stage, including a half-latch circuit, and a true and complement address generating circuit coupled to the output of the output of the write port address buffer, including a pair of two-stage rails, each rail including a first stage comprising a two-way NAND circuit, and a second stage, coupled to the output of the first stage, including a half-latch circuit.

15. The macro of claim 1, wherein the write decoder and write word line driver circuit includes first and second 5-way NOR circuits for decoding the first and second conditioned write address signals from the first and second write address buffers, respectively, and a 2-way NAND coupled to receive the priority signal and the output of the 5-way NOR corresponding to the second write address signal to give priority to the writing of the second write address.

16. The macro of claim 1, further comprising a reset timing control circuit including means for generating and delivering timing and control signals to the input isolation circuit, first write address buffer, second write address buffer, write decoder and write word line driver, and write enable signal generator.

* * * * *